(12) United States Patent
Dwari et al.

(10) Patent No.: US 12,095,368 B2
(45) Date of Patent: Sep. 17, 2024

(54) COMPACT CIRCUIT DEVICES USING CERAMIC-COPPER LAYERS BASED PACKAGING

(71) Applicant: Hamilton Sundstrand Corporation, Charlotte, NC (US)

(72) Inventors: Suman Dwari, Vernon, CT (US); Brian St. Rock, Andover, CT (US); Jeffrey Ewanchuk, Manchester, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 547 days.

(21) Appl. No.: 17/339,594

(22) Filed: Jun. 4, 2021

(65) Prior Publication Data
US 2022/0393590 A1 Dec. 8, 2022

(51) Int. Cl.
H02M 3/158 (2006.01)
H01L 21/768 (2006.01)
H01L 27/06 (2006.01)

(52) U.S. Cl.
CPC .......... *H02M 3/158* (2013.01); *H01L 21/768* (2013.01); *H01L 27/0688* (2013.01)

(58) Field of Classification Search
CPC ... H02M 3/158; H01L 21/768; H01L 27/0688
See application file for complete search history.

(56) References Cited

U.S. PATENT DOCUMENTS

| 10,351,477 B2 | 7/2019 | Meyer et al. |
| 2007/0286946 A1 | 12/2007 | Yamaguchi et al. |
| 2019/0172991 A1 | 6/2019 | Lee |
| 2020/0120813 A1 | 4/2020 | Dunford et al. |
| 2021/0408978 A1* | 12/2021 | Chidurala ................ H03F 1/56 |

FOREIGN PATENT DOCUMENTS

| DE | 102014203309 A1 | 8/2015 |
| EP | 1447280 A2 | 8/2004 |
| EP | 3326986 B1 | 11/2020 |

OTHER PUBLICATIONS

Josifovic, et al. "A PCB System Integration Concept for Power Electronics" Delft University of Technology/Electrical Energy Conversion, Delft, 2628CD, The Netherlands, IEEE, IPEMC 2009, pp. 756-762.
European Search Report for Application No. 22171797.8, mailed Oct. 25, 2022, 74 pages.

* cited by examiner

*Primary Examiner* — Rafael O Leon De Domenech
(74) *Attorney, Agent, or Firm* — CANTOR COLBURN LLP

(57) ABSTRACT

A power converter includes an amplifier, an inductor, a capacitor, and an interconnection block formed of an insulating material having conductive material deposited thereon by a multi-material printing process. The interconnection block supports one of the inductor and the capacitor in a manner that the one the inductor and the capacitor is disposed vertically above an other of the inductor and the capacitor.

7 Claims, 4 Drawing Sheets

COMPACT CIRCUIT DEVICES USING CERAMIC-COPPER LAYERS BASED PACKAGING

BACKGROUND

Exemplary embodiments pertain to the art of circuit based electrical devices, and in particular, packaging of electrical devices such as power converters in a compact ceramic/metal holder.

Despite improvements in semiconductor technology, and material developments in passive components, the power density of devices such as power converters may be limited by thermoelectrical loading limits of the device and the interconnections therein. Typically, thermal conduction paths in electrical devices are orthogonal to the current conduction paths. Further, such devices typically have the elements therein laid out in a two-dimensional (2D) configuration with all components being generally attached to a top side of a planar base. This base includes the interconnections of the circuit elements on its top (or within it). Thus, the "width" of the device is determined based on the number of elements. This can lead to a low power density in some cases.

BRIEF DESCRIPTION

Disclosed is a power converter that includes an amplifier, an inductor, a capacitor and an interconnection block formed of an insulating material having conductive material deposited thereon by a multi-material printing process. The interconnection block supports one of the inductor and the capacitor in a manner that the one the inductor and the capacitor is disposed vertically above an other of the inductor and the capacitor.

In addition to one or more of the features described above, or as an alternative to any of the foregoing embodiments, the insulating material can be ceramic and the conductive material can be metal.

In addition to one or more of the features described above, or as an alternative to any of the foregoing embodiments, the capacitor is placed in the interconnection block.

In addition to one or more of the features described above, or as an alternative to any of the foregoing embodiments, the capacitor is formed in the interconnection block.

In addition to one or more of the features described above, or as an alternative to any of the foregoing embodiments, the power converter can also include an outlet connector that has an outlet connector height. In one embodiment, the interconnection block has height that is less the outlet connector height.

In addition to one or more of the features described above, or as an alternative to any of the foregoing embodiments, both the inductor and the capacitor are disposed vertically above the amplifier.

Also disclosed is a circuit that includes a height limiting device having a limiting height, two or more additional circuit elements, and an interconnection block formed of an insulating material having conductive material deposited thereon by a multi-material printing process. The interconnection block supports one of the addition circuit elements vertically above another one of the additional circuit elements and has height that is less than the limiting height.

In addition to one or more of the features described above, or as an alternative to any of the foregoing embodiments, the insulating material can be ceramic and the conductive material can be metal.

In addition to one or more of the features described above, or as an alternative to any of the foregoing embodiments, one of the additional element is a capacitor that is placed in the interconnection block.

In addition to one or more of the features described above, or as an alternative to any of the foregoing embodiments, one of the additional elements is a capacitor that is formed in the interconnection block.

In addition to one or more of the features described above, or as an alternative to any of the foregoing embodiments, the height limiting device is an interconnection block.

Also disclosed is a method of forming a circuit. The method includes: forming an interconnection block of an insulating material having conductive material deposited thereon by a multi-material printing process; disposing one or more circuit elements in the interconnection block such that the block supports one of the one or more circuit elements a manner such that it is disposed vertically above an other of the one or more circuit elements.

In addition to one or more of the features described above, or as an alternative to any of the foregoing methods, the insulating material can be ceramic and the conductive material can be metal.

In addition to one or more of the features described above, or as an alternative to any of the foregoing methods, one of the one or more circuit elements is a capacitor and the capacitor is placed in the interconnection block.

In addition to one or more of the features described above, or as an alternative to any of the foregoing methods, one of the one or more circuit elements is a capacitor and the capacitor is formed in the interconnection block while the block if formed.

In addition to one or more of the features described above, or as an alternative to any of the foregoing methods, the method can further include forming an outlet connector that has an outlet connector height, and the interconnection block has height that is less the outlet connector height.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

Embodiments herein are directed to devices such as power converters that have improved power density. While the following examples refer to power converters specifically, the teachings herein could be utilized in other devices.

In one embodiment, active and passive components of a device such as a power converter can be packaged together using a three-dimensional (3D) interconnection substrate. This 3D interconnection substrate allows for the integration of components to be made in any direction, due to the use of a copper conductor and ceramic insulator. In particular, this can allow for circuit elements to be stacked vertically and reduce the width of a circuit.

In some instances, the interconnection substrate can be a block formed additive manufacturing methods that allow for two or more materials to be utilized. Such a process can be referred to as a multi-material printing herein. In a specific embodiment, layers (e.g. ultra-thin in single digit um range) of an electrical insulating and thermally conductive material (e.g., ceramic) and an electrically conductive material (e.g., copper) are formed by powder deposition particles, which can then be fused together in a sintering step to form a non-porous interconnection for the electrical device. The thin layers then sintered into desired shape and 3D packaging to achieve high power density of devices such as power electronic converter.

Figure 1:
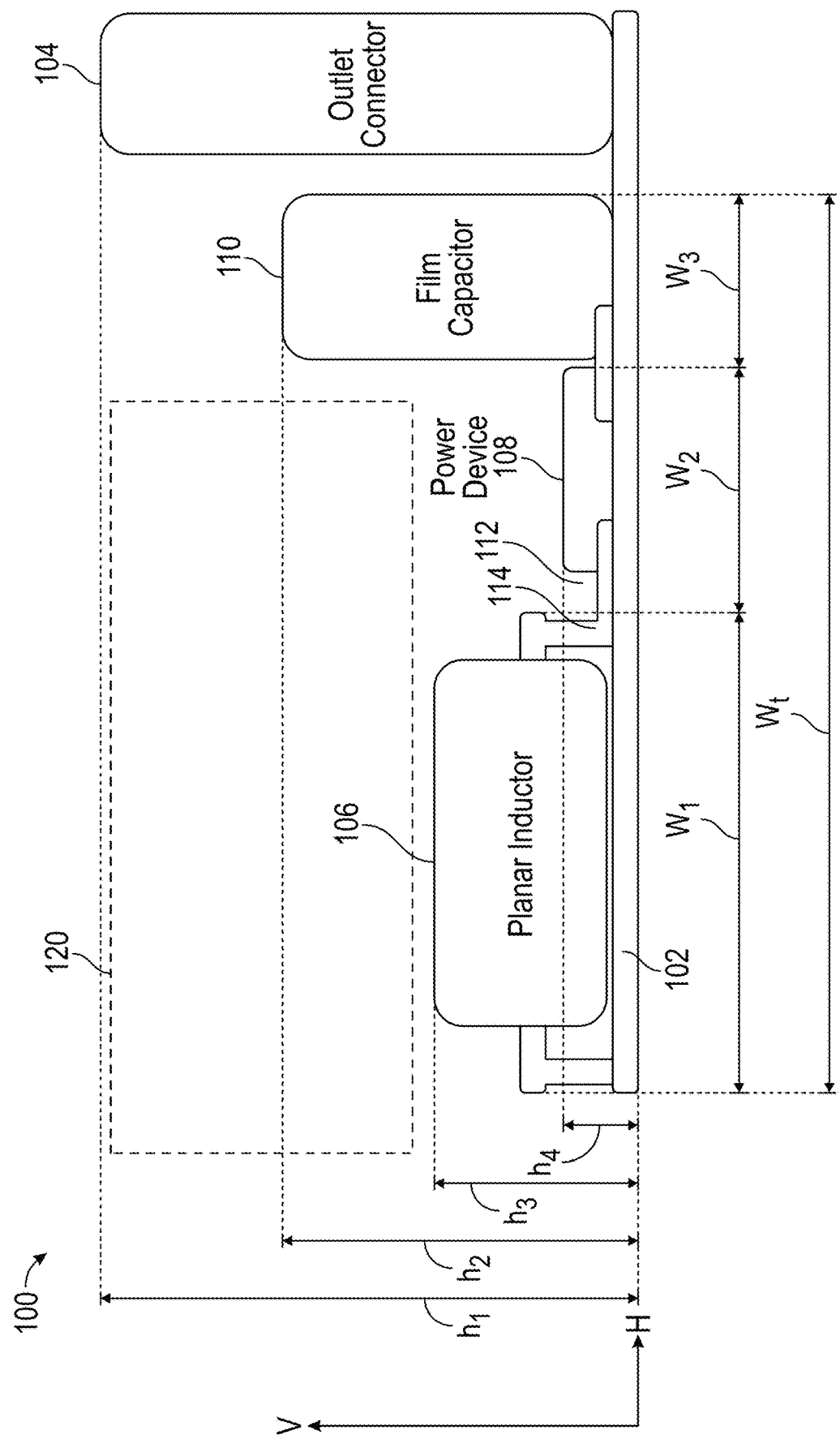
FIG. 1 is an example of circuit laid out in two-dimensional manner.

FIG. 1 illustrates an exemplary circuit 100 (in this case a power converter) arranged in a 2-D manner along a planar substrate 102. The circuit 100 includes, for example, an outlet connector 104. In this case, the outlet connector 104 has a height ($h_1$). As shown, this outlet connector 104 has the greatest height measured in the vertical direction (V) measured from the substrate 104. As this is the tallest element in the circuit 100 herein, such an element can also be referred to as a height limiting element. It should be understood that the "height limiting element" being the connector is not required but, rather, can be applied to the element having the greatest height.

The circuit 100 also include additional circuit elements 106, 108 and 110. In this non-limiting example, the circuit elements are inductor 106, an amplifier 108 and a capacitor 110. As arranged, the inductor 106 has a height ($h_3$), the amplifier 108 has a height ($h_4$), and the capacitor 110 has a height ($h_2$), wherein $h_4 h_3 > h_2 > h_1$. Each of these elements are generally shown as being electrically interconnected by electrical traces 112 on the top surface of the substrate 102. Of course, additional conductors such as connectors 114 can connect the elements to the traces.

The additional circuit elements 106, 108 and 110 also have width measured in the horizontal direction (H) along the surface of the substrate 102. In this example (and generally measuring based on adjacent elements sharing the width of interconnecting traces 112), the inductor 106 has a width of $w_1$, the amplifier 108 has a width of $w_2$ and capacitor 110 has width $w_3$. These elements have a total width of $w_t$. In such an arrangement, therefore the size of the package of the device 100 is at least $h_1 \times w_t$. Indeed, $h_1 \times w_t$ only accounts for the footprint of the additional circuit elements 106, 108 and 110 and excludes the connector. One advantage of such a system is that it has good heat dissipation as there is "open" space above each of the additional circuit elements 106, 108 and 110. This open space is shown generally by dashed box 120.

Embodiments herein can reduce the size of the open space and still provide for efficient heat transfer. In particular, in one embodiment a device such as a power converter is provided where one or more additional circuit elements are supported in an interconnection block. The interconnection block can be formed of ceramic and that includes electrical connecting elements deposited on various surfaces thereof. The electrical connecting elements can be used to connected the one or more additional circuit elements and/or the height limiting element. In one embodiment, the additional circuit elements are arranged in a supported by the block and receive electrical power from the electrical connecting elements such that at least one portion of one of the one or more additional circuit elements is disposed vertically above one or more of the one or more additional circuit elements. As will be more fully shown below, this can reduce the about of open space in the circuit. This reduction, however, does not negatively affect cooling because the dielectric of the interconnection block is a good conductor of heat.

Figure 2:
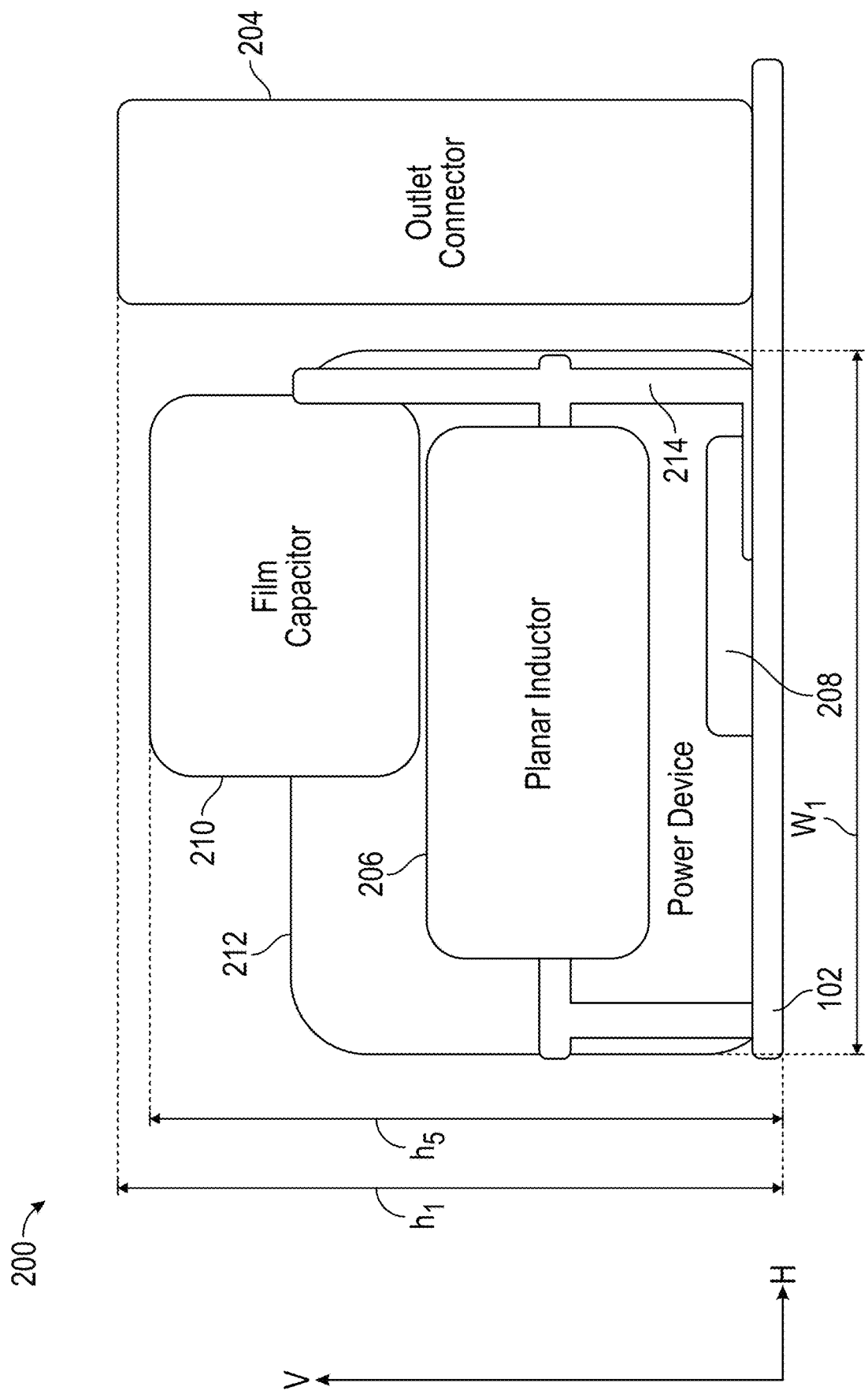
FIG. 2 is an example of circuit (in this case, a power converter) laid out in three-dimensional manner according to one embodiment.

Reference will now be made to FIG. 2 where an example circuit is illustrated. The circuit 200 can be, for example, a power converter. As before, the circuit is shown being carrier on a planar substrate 102.

The circuit 200 includes an outlet connector 204. In this case, the outlet connector 204 has a height ($h_1$). As shown, this outlet connector 104 has the greatest height measured in the vertical direction (V) measured from the substrate 102. As this is the tallest element in the circuit 200 herein, such an element can also be referred to as a height limiting element. It should be understood that the "height limiting element" being the connector is not required but, rather, can be applied to the element having the greatest height.

Similar to the above, the circuit 200 also include additional circuit elements 206, 208 and 210. In this non-limiting example, the circuit elements are inductor 206, an amplifier 208 and a capacitor 210. As arranged, the inductor 06 is disposed vertically over (or above) at least a portion (in this case, all of) of the amplifier 208. Similarly, the capacitor 210 is disposed over at least a portion of the inductor 206. Of course, the relative locations of the elements could be changed and, for example, the inductor could be vertically above the capacitor.

The additional circuit elements 206, 208 and 210 are supported by an interconnection block 212. This block includes ceramic portion 220 and electrical connecting elements 214 that connect the additional circuit elements to at least one of power or other additional circuit elements or a combination thereof to form a circuit. As arranged, the combination of the additional circuit elements 206, 208 and 210 and the interconnection block 212 has a total height $h_5$. In one embodiment, $h_5$ is less than the height of the height limiting element (in this case the connector 204). Thus, as configured, the area of the block 212 and the elements is $w_1 \times h_5$ which is, of course, smaller than the embodiment in FIG. 1 and achieves a substantial space savings. Forming the block 212 of ceramic can overcome the loss of the open space 120 due to its good heat conduction properties.

Figure 3:
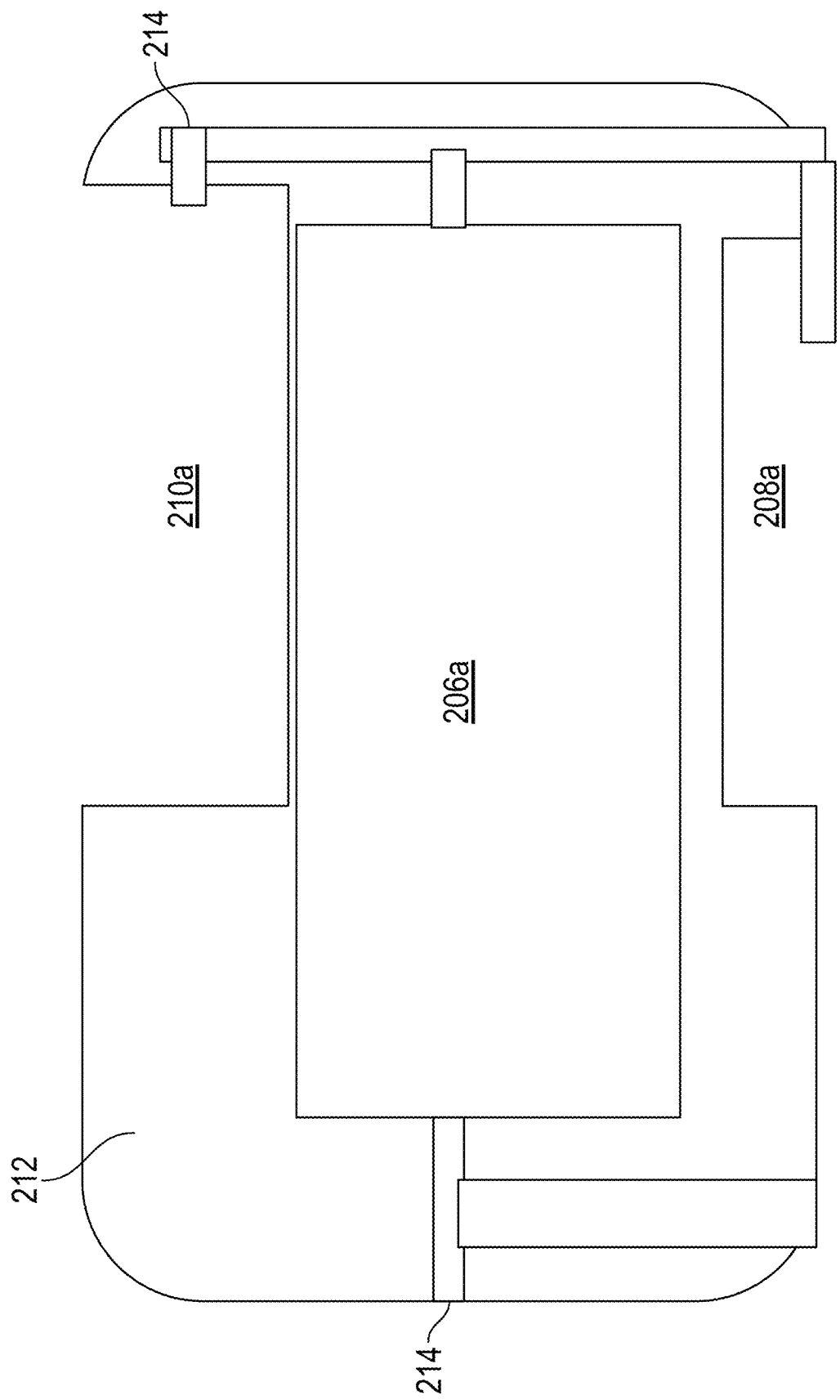
FIG. 3 shows an example of interconnection substrate according to one embodiment.

FIG. 3 shows an example of an interconnection block 212 according to one embodiment. As illustrated, the additional circuit elements 206, 208 and 210 of FIG. 3 have not yet be added to the block. Rather, the block 212 includes corresponding voids 206a, 208a and 210a sized as shaped so that the correspond to and can receive the additional circuit elements 206, 208 and 210 therein. The additional circuit elements 206, 208 and 210 can be inserted and electrical connections from the electrical connecting elements 214 to the additional circuit elements 206, 208 and 210 by, for example, soldering. It will be understood, however, that one or move the additional circuit elements 206, 208 and 210 could be integrally formed in the interconnection block 212. For example, the capacitor (210 in FIG. 2) could be formed by depositing layers of copper that at separated by ceramic or another material during the construction process described below. It shall be noted that the voids 206a, 208a and 210a.

As will be understood, and described below, the voids 206a, 208a and 210a can be formed by adding a third material (different than the ceramic of the block 212 or the metal electrical connecting elements 214) during deposition process that can then be etched away to form voids 206a, 208a and 210a.

Figure 4:
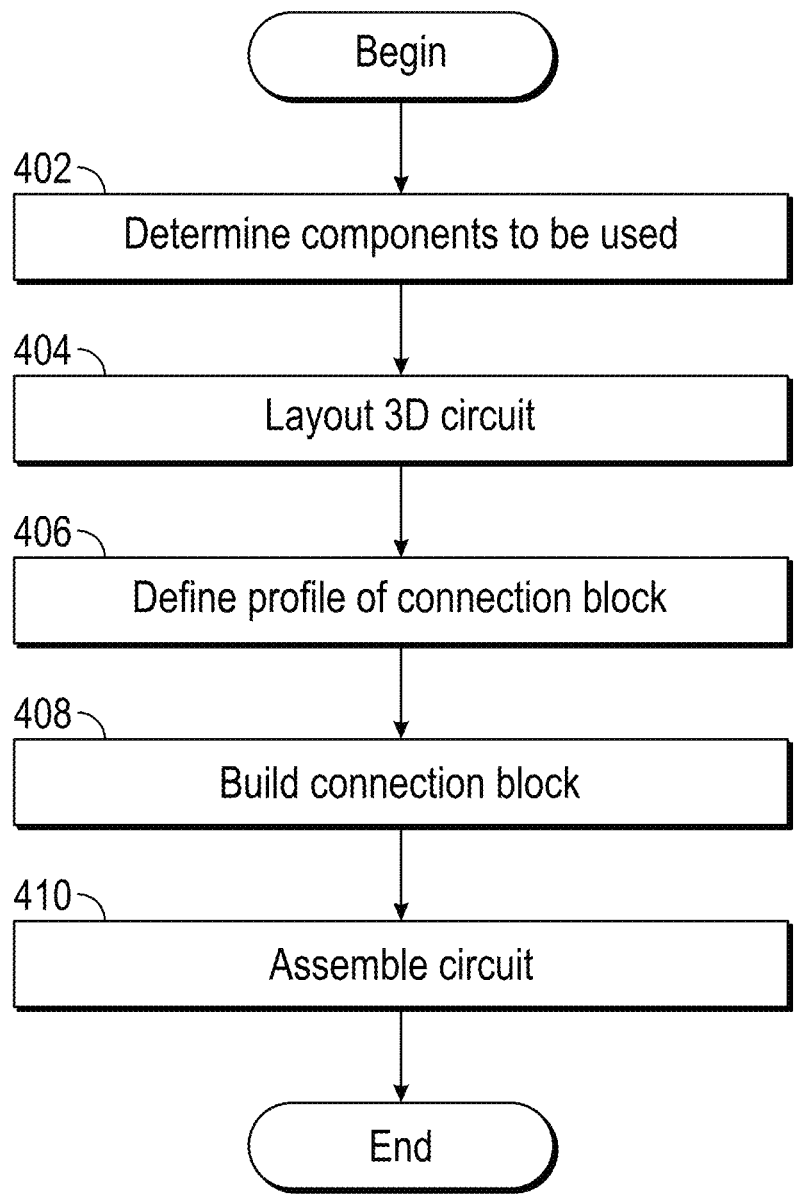
FIG. 4 is block diagram of a method according to one embodiment.

FIG. 4 is flow chart of a method than can be used to form a circuit (e.g., a power converter) according to one embodiment. The process begins by determining the components of the circuit and their various sizes as indicated at block 402. This can include, for example, determining a heat load that will be created by the components in the circuit.

At block 404 a layout of the circuit is determined. This process can include either manual or computer-based optimization that arranges the components of the circuit so as to minimize the 3D footprint the circuit. Further, this process can take into account the heat load for each component. For example, the inductor 206 may generate more heat that the capacitor 210. As such it may be better located such that it is completely surrounded by the highly efficient heat transfer properties of the ceramic forming the block 212.

The operations in block 404 can also include changing orientations of the components and arranging them over one another. Further, this process can include establishing a height limiting element such as the outlet connector 104 of FIG. 1. Such an element may not be inserted into a void in one embodiment, but it could be if desired. Selection of the height limiting element will set a maximum height of the circuit in one embodiment. The selection of such an element can be driven by size or by other requirements such as accessibility (e.g., the in the case of the power converter, regardless of size, it may be required that outlet connector be oriented in a particular manner and located in an "outer" side of the circuit to allow for easy connection to other devices). It shall be understood that selection of a height limiting device is not required and user can select a maximum height based on other factors such as available space for the circuit in it intended use case.

Based on the determined orientation and location of voids, a profile of the connection block can be created such that it can formed by an advanced manufacturing process as indicated at block 406. This profile is then used to form the connection block as indicated at block 408. This can include a process/machine that utilizes a powder deposition of particles to build the connection block by laying down successive thin (um) layers of ceramic or copper. The resulting "loose" particles can then be fused together in a sintering step to form a non-porous substrate for the power converter. Further, the skilled artisan in the advanced manufacturing art will realize based on the teachings herein that by adding a third material in the deposition process, cavities can be formed in this substrate which can then be etched away to form air gaps for component placements. The removal can be done before or after sintering.

After the connection block is formed, the additional circuit elements 206, 208 and 210 can be added into the block and electrically connected to the conductors to form the desired circuit as indicated at block 410.

By having the ability to provide for a supported and non-specific orientation of the additional circuit elements 206, 208 and 210 and due to the utilization of ceramic to form the connection block the thermal conduction properties of the converter and electrical connection requirements can be maximized.

For instance, and with reference to the above circuits, the typically poor thermally loaded capacitor 110 can be integrated on the top of a lesser thermally loaded inductor 106, which is then on top of a thermally bound amplifier 108, which is the closest to the heat exchange. As the electrically insulating material is ceramic, the thermal gradients are still minimized within a single power block, as the thermal conductivity of this material is significantly better than air.

Naturally, variations can exist where basic building blocks from essential circuit (e.g., power converter) components are packaged together to form more complex circuit structures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A power converter comprising:
   a substrate;
   an amplifier disposed vertically above the substrate;
   a planar inductor;
   a capacitor; and
   an interconnection block formed of an insulating material having conductive material deposited thereon by an additive manufacturing multi-material printing process;
   wherein the interconnection block supports both the inductor and the capacitor in a manner that the one the inductor and the capacitor is disposed vertically relative to the substate above an other of the inductor and the capacitor;
   the converter further comprising:
   an outlet connector that has an outlet connector height;
   wherein the interconnection block has height that is less the outlet connector height,
   wherein both the inductor and the capacitor are disposed vertically relative to the substrate above the amplifier.

2. The power converter of claim 1, wherein the insulating material is ceramic and the conductive material is metal.

3. The power converter of claim 1, wherein the capacitor is placed in the interconnection block.

4. The power converter of claim 1, wherein the capacitor is formed in the interconnection block.

5. A method of forming a circuit, the method comprising:
   providing a substrate;
   connecting an amplifier vertically above the substrate forming an interconnection block of an insulating material having conductive material deposited thereon by an additive manufacturing multi-material printing process; and disposing a capacitor and a planar inductor in the interconnection block such that the block supports the capacitor and the;

connecting an outlet connector that has an outlet connector height to the substrate;

attaching the interconnection block to the substate;

wherein the interconnection block has height that is less the outlet connector height, wherein both the inductor and the capacitor are disposed vertically relative to the substrate above the amplifier.

6. The method of claim 5, wherein the insulating material is ceramic and the conductive material is metal.

7. The method of claim 5, wherein the capacitor is formed in the interconnection block while the block is formed.

\* \* \* \* \*